United States Patent
Liu et al.

[11] Patent Number: 6,165,861
[45] Date of Patent: Dec. 26, 2000

[54] INTEGRATED CIRCUIT POLYSILICON RESISTOR HAVING A SILICIDE EXTENSION TO ACHIEVE 100% METAL SHIELDING FROM HYDROGEN INTRUSION

[75] Inventors: Ruey-Hsin Liu; Jun-Lin Tsai; Yung-Lung Hsu, all of Hsin-Chu, Taiwan

[73] Assignee: Taiwan Semiconductor Manufacturing Company, Hsin-chu, Taiwan

[21] Appl. No.: 09/152,348

[22] Filed: Sep. 14, 1998

[51] Int. Cl.[7] .................................................. H01L 21/20
[52] U.S. Cl. ........................ 438/382; 438/384; 438/649; 438/659
[58] Field of Search ...................... 438/597, 649, 438/659, 510, 532, 533, 382, 384

[56] References Cited

U.S. PATENT DOCUMENTS

| | | | |
|---|---|---|---|
| 4,968,645 | 11/1990 | Baldi et al. | 437/200 |
| 5,135,882 | 8/1992 | Karniewicz | 437/52 |
| 5,168,076 | 12/1992 | Godinho et al. | 437/60 |
| 5,356,826 | 10/1994 | Natsume | 437/60 |
| 5,462,894 | 10/1995 | Spinner et al. | 437/195 |
| 5,618,749 | 4/1997 | Takahashi et al. | 438/84 |
| 5,705,436 | 1/1998 | Chin et al. | 438/238 |
| 5,852,311 | 12/1998 | Kwon et al. | 257/315 |

*Primary Examiner*—Caridad Everhart
*Attorney, Agent, or Firm*—George O. Saile; Stephen B. Ackerman

[57] ABSTRACT

A stable, high-value polysilicon resistor is achieved by using a silicide layer that prevents diffusion of hydrogen into the resistor. The resistor can also be integrated into a salicide process for making FETs without increasing process complexity. A polysilicon layer with a cap oxide is patterned to form FET gate electrodes and the polysilicon resistor. The lightly doped source/drains, insulating sidewall spacers, and source/drain contacts are formed for the FETs. The cap oxide is patterned to expose one end of the resistor, and the cap oxide is removed from the gate electrodes. A refractory metal is deposited and annealed to form the salicide FETs and concurrently to form a silicide on the end of the resistor. The unreacted metal is etched. An interlevel dielectric layer is deposited and contact holes with metal plugs are formed to both ends of the resistor. A metal is deposited to form the first level of metal interconnections, which also provides contacts to both ends of the resistor. The metal is also patterned to form a metal shield over the resistor to prevent hydrogen diffusion into the resistor. In this invention the spacing between the metal portions contacting the ends of the resistor is aligned over the silicide on the resistor to provide 100% shielding from hydrogen diffusion into the resistor.

20 Claims, 3 Drawing Sheets

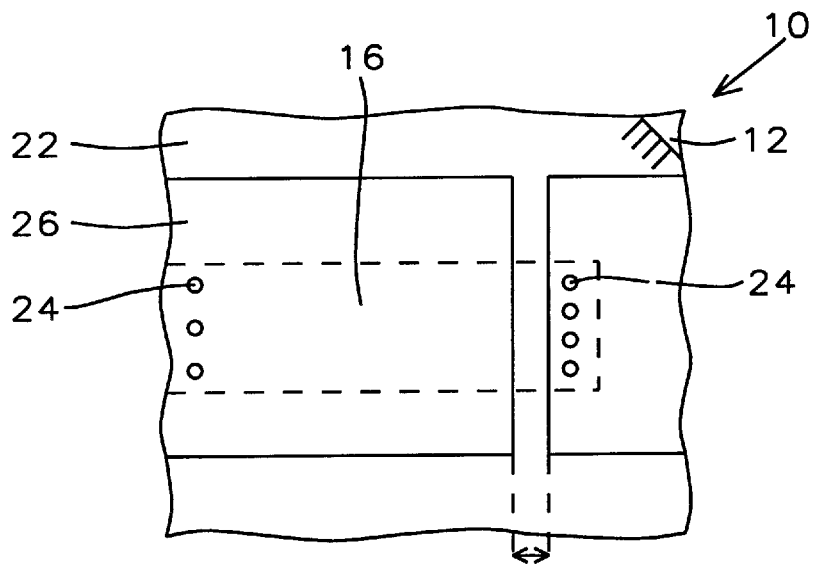
*FIG. 1 - Prior Art*
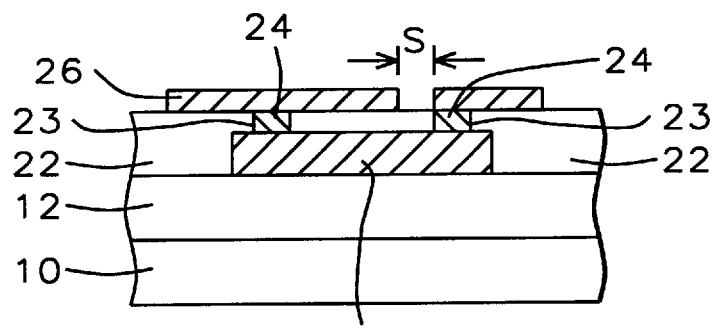
*FIG. 2 - Prior Art*
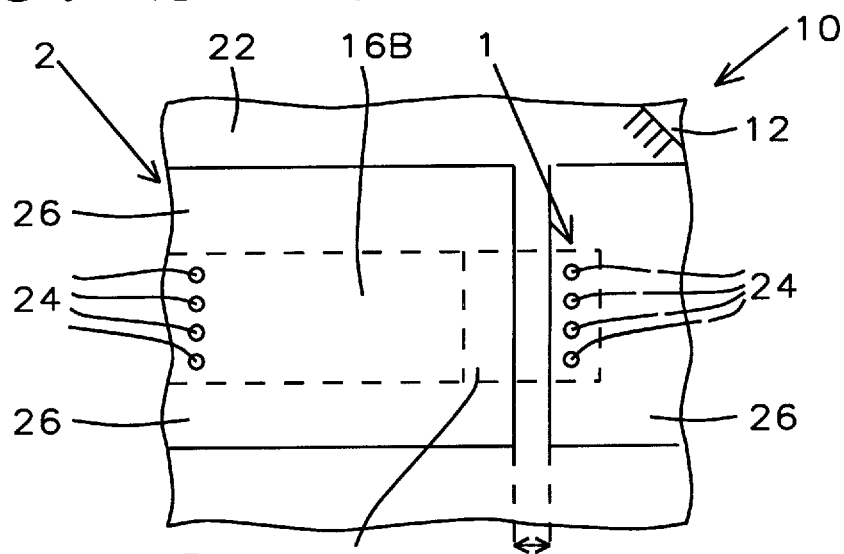
*FIG. 3*

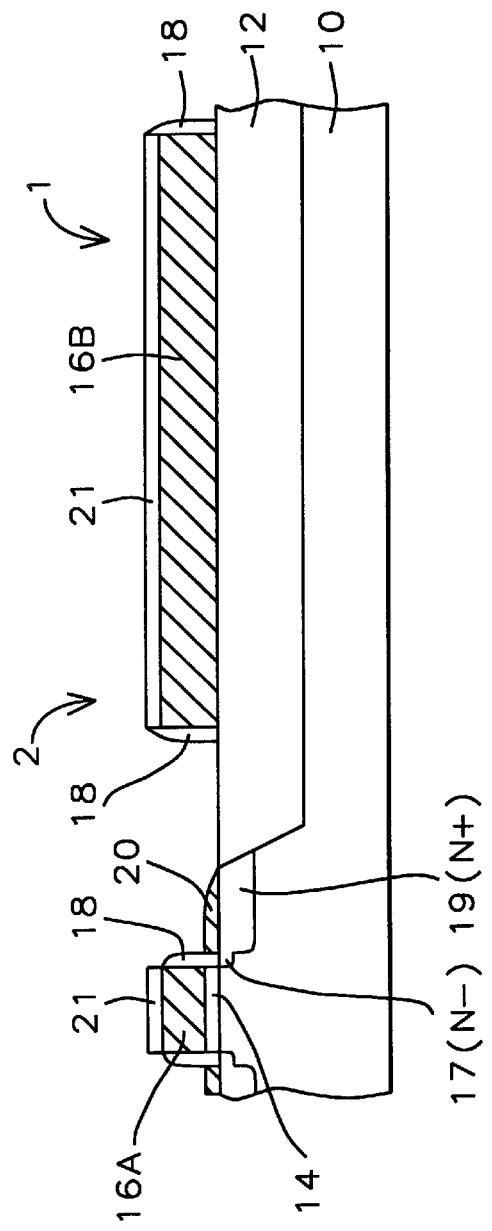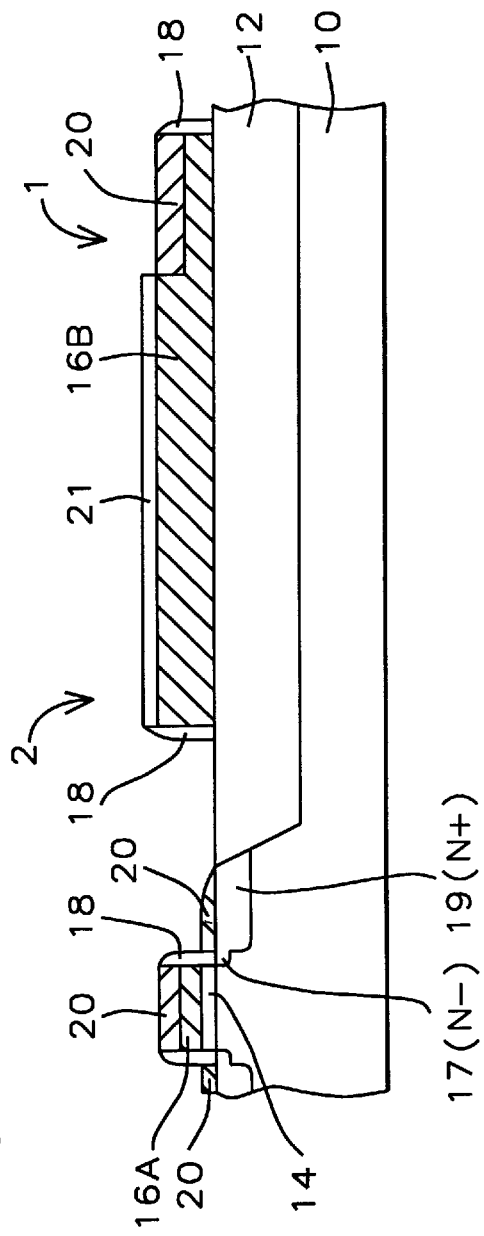
FIG. 4
FIG. 5

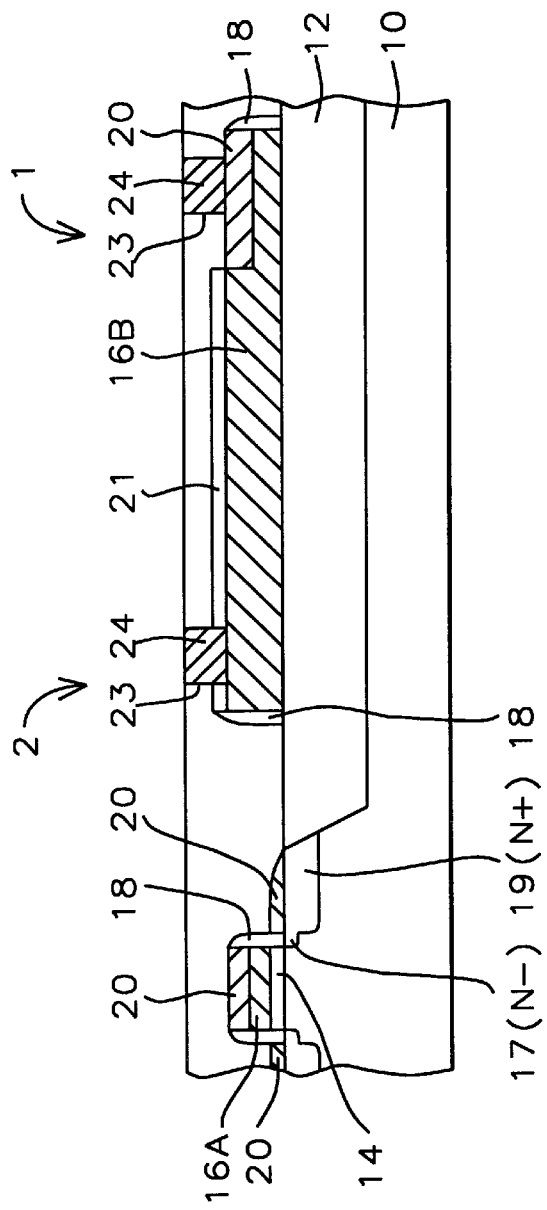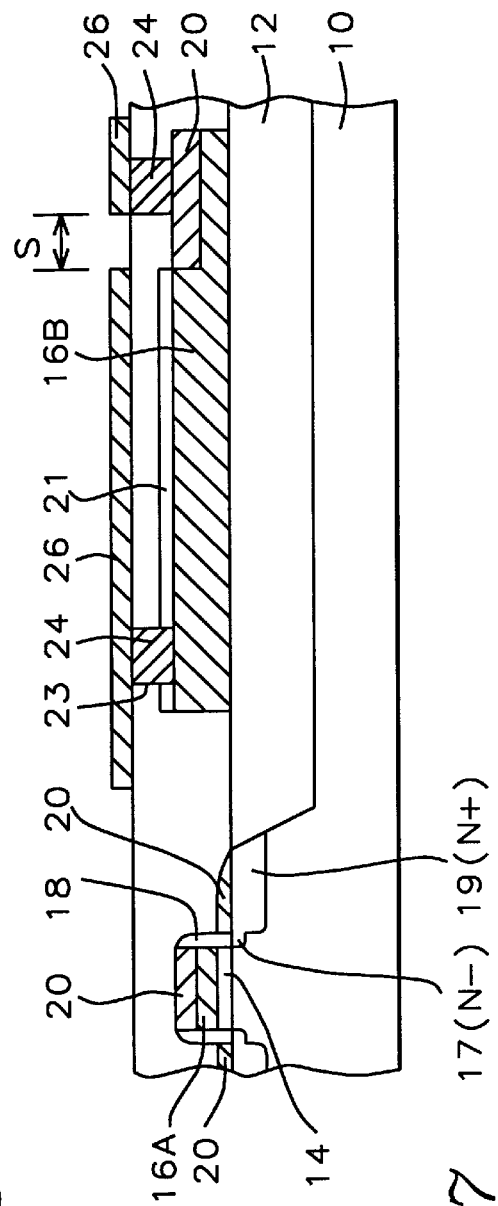

INTEGRATED CIRCUIT POLYSILICON RESISTOR HAVING A SILICIDE EXTENSION TO ACHIEVE 100% METAL SHIELDING FROM HYDROGEN INTRUSION

BACKGROUND OF THE INVENTION (1) Field of the Invention

The present invention relates to the fabrication of integrated circuit devices on semiconductor substrates, and more particularly to a structure and fabrication method for making polysilicon resistors with stable high resistance for mixed signal (analog/digital) integrated circuits. A silicide extension on the polysilicon resistor provides 100 percent metal shielding that prevents hydrogen ions from permeating the resistor, thereby providing more stable high value resistors.

(2) Description of the Prior Art

Many integrated circuits utilize both analog and digital circuits on the same chip. CMOS circuits provide low voltage, low power consumption for digital applications, while bipolar transistors require higher voltage and provide high current gain capabilities. These bipolar/complementary-metal-oxide-silicon (BiCMOS) circuits for ULSI with minimum feature sizes, (e. g., less than 025 um) require high value resistors that occupy the minimal surface on the chip. Polysilicon resistors formed on the field oxide (FOX) are preferred over diffused resistors in the silicon substrate because the diffused resistors require junction isolation with high capacitance that increases the RC time constant and degrades circuit performance. Also, the polysilicon resistor can be integrated into the Field effect transistor (FET) process without significantly increasing the process complexity.

Unfortunately, after forming the polysilicon resistor and during subsequent processing to form the multilevels of metal interconnections, hydrogen can rapidly diffuse through the interlevel and intermetal dielectric insulating layers into the resistor. The hydrogen intrusion can then fill the trapping states at the polysilicon grain boundary, thereby causing reduction and fluctuation in the resistance. One method of avoiding this problem by the prior art is to use a metal shield, formed from the first level of metal interconnections, over the resistor to shield the resistor from the diffusing hydrogen. This is best understood with reference to the schematic top view in FIG. 1 and the cross-sectional view in FIG. 2. FIGS. 1 and 2 show a conventional polysilicon resistor 16, formed from a patterned polysilicon layer, over a field oxide 12. An interlevel dielectric layer 22 is deposited over the resistor 16, and contact holes 23 are etched and metal plugs 24 are formed in the contact holes at both ends of the resistor. The first level of metal interconnections 26 is formed to make electrical contact to the resistor over the metal plugs. In this conventional method, the metal 26 is also patterned to extend over the body of the resistor to prevent hydrogen diffusion into the resistor 16 during subsequent processing, as shown in the top view of FIG. 1. However, it is necessary to provide a minimum spacing S between the metal contacting the plugs 24 to prevent shorting between the contacts at both ends of the resistor. This provides a path for hydrogen diffusion through the interlevel dielectric layer 22 into the resistor. Therefore there is still a need to improve upon the prior art to further minimize this hydrogen diffusion into the resistor.

Several methods of forming high-resistive elements on an integrated circuit are described in the literature. In U.S. Pat. No. 5,462,894 to Spinner et al., a polysilicon layer is oxidized to form a thin polysilicon resistor having high resistance, and doped or silicide contacts at both ends of the resistor. In U.S. Pat. No. 5,356,826 to Natsume, and in U.S. Pat. No. 5,618,749 to Takahashi et al. methods are shown for concurrently forming a polysilicon resistor, a capacitor, and a MOSFET. U.S. Pat. No. 5,135,882 to Karniewicz teaches a method for making high-value internodal coupling resistors for SRAM formed from a second polysilicon layer and having silicide contacts. U.S. Pat. No. 5,168,076 to Godinho et al., and U.S. Pat. No. 5,705,436 to Chin et al. describe methods for making polysilicon load resistors for SRAM. U.S. Pat. No. 4,968,645 to Baldi et al. describes a method for forming an intermediate connecting level composed of polycide and polysilicon portions for forming low-resistive interconnections and resistors on an integrated circuit.

However, there is still a need in the semiconductor industry to provide stable, high-value polysilicon resistors that are immune from hydrogen intrusion during processing.

SUMMARY OF THE INVENTION

It is therefore a principal object of this invention to form stable, high-resistance-value polysilicon resistors for integrated circuits on semiconductor substrates.

It is another object of this invention to utilize a polycide extension on the polysilicon resistor that extends the metal shielding to 100% and thereby prevents hydrogen ions from diffusing through the oxide and into the polysilicon resistor.

Still another object of this invention is to integrate these improved polysilicon resistor structures into the integrated circuits while forming salicide field effect transistors (FETs), thereby providing a cost-effective manufacturing process.

In accordance with the objects of the invention, a method for fabricating improved polysilicon resistors for integrated circuits is described. The method and structure can be integrated with self-aligned silicide (salicide) FETs without significantly increasing processing complexity. In the prior art, a metal shield formed from the first metal layer is used to prevent hydrogen ions from diffusing through the overlying intermetal dielectric layer(s) and into the resistor causing variable and unstable resistance. Since the metal layer is patterned to make electrical connections to the ends of the resistor, the metal layer cannot completely cover the resistor because a separating space (S) or gap is required to make the two contacts to the resistor without electrical shorting. This prior art, therefore, does not provide 100% metal shielding from hydrogen intrusion into the resistor. This new resistor structure and method overcome the problem associated with prior art high-value resistors by including a polycide layer that extends under the separating space S and provides 100% shielding from hydrogen diffusion. This invention is compatible with traditional salicide process without creating additional process complexity.

The method for making polysilicon resistors and field effect transistors (FETs) begins by providing a semiconductor substrate. Field oxide regions, such as shallow trench isolation (STI), are formed surrounding and electrically isolating device areas for the FETs. A thin gate oxide is grown on the device areas for the FETs. A polysilicon layer is deposited on the substrate and a cap oxide is formed by thermally oxidizing the top surface of the polysilicon layer. Using a first photoresist ion-implant block-out mask, the polysilicon layer is doped over the device areas, and a second photoresist ion-implant block-out mask is used to dope the polysilicon layer to a predetermined concentration for the polysilicon resistors over the field oxide regions. The polysilicon layer having the cap oxide layer is patterned to form gate electrodes on the device areas, and concurrently polysilicon resistors having a first end and a second end are formed on the field oxide regions. Next, lightly doped source/drain areas are formed by ion implantation adjacent to the gate electrodes in the device areas, while the resistors are protected from implantation by a photoresist block-out mask. An insulating layer is deposited and anisotropically etched back to form sidewall spacers on the gate electrodes. Source/drain contact areas are formed adjacent to the sidewall spacers in the device areas by ion implanting while using a photoresist block-out mask to protect other areas of the substrate from implantation. The cap oxide is removed from the gate electrodes, and concurrently the cap oxide is patterned over the resistors removing a portion over the first ends of the resistors. A refractory metal layer, such as titanium (Ti) is deposited and annealed at a temperature of less than 700° C. to form titanium silicide ($TiSi_2$) on the gate electrodes, $TiSi_2$ on the source/drain contact areas, and, by the method of this invention, a $TiSi_2$ layer over the first ends of the polysilicon resistors. The unreacted Ti metal over the oxide surfaces on the substrate is selectively removed by etching in a solution of $NH_4OH$, hydrogen peroxide ($H_2O_2$), and deionized water at room temperature, and then a second anneal of about 800° C. is argon (Ar) is used to lower the $TiSi_2$ sheet resistance and to stabilize the $TiSi_2$ phase.

An interlevel dielectric layer is deposited over the FETs and over the resistors on the substrate and can be optionally planarized. Next, contact holes are etched in the interlevel dielectric layer including contact holes to the first and second ends of the polysilicon resistor. The contact holes to the first end are over and to the silicide layer on the resistors. The contact holes are then filled with metal plugs, such as tungsten (W). The first level of metal interconnections are formed next by depositing and patterning a metal layer, such as aluminum/copper (AlCu). The metal is also patterned to make electrical contact to the metal plugs. The patterned metal layer also extends over the polysilicon resistors to prevent hydrogen from diffusing through the interlevel dielectric layer and into the polysilicon resistors. A key feature of this invention is to pattern the metal layer so that the spacing between the metal contacts to the metal plugs making contact to the resistors at the first and second ends is aligned over the silicide layer. The silicide layer under the spacing S increases the shielding to 100% and therefore further protects the polysilicon resistor from hydrogen intrusion. The integrated circuit can now be completed by including additional levels of intermetal dielectrics and metal layers. During completion of the integrated circuit, by including additional intermetal dielectrics and metal layers, when hydrogen is generated the metal shielding prevents this hydrogen from diffusing into the resistor.

BRIEF DESCRIPTION OF THE DRAWINGS

The objects and other advantages of the invention are best understood with reference to the embodiment and in conjunction with the following drawings.

FIG. 1 is a prior-art schematic top view of a polysilicon resistor showing the spacing S between two metal contacts for the resistor through which hydrogen can diffuse into the resistor.

FIG. 2 is a prior-art schematic cross-sectional view of a polysilicon resistor in FIG. 1 also showing the spacing S between two metal contacts for the resistor through which hydrogen can diffuse into the resistor.

FIG. 3 is schematic cross-sectional view of a polysilicon resistor having a silicide over the polysilicon resistor and under the spacing S to provide 100% protection from hydrogen intrusion into the resistor by the method of this invention.

FIGS. 4 through 7 show schematic cross-sectional views of the polysilicon resistor of this invention integrated with a polycide gate electrode field effect transistor made by the salicide process.

DESCRIPTION OF THE PREFERRED EMBODIMENT

In keeping with the objects of this invention, the method for using a silicide extension to form a stable, high-resistance resistor and concurrently forming an FET using a salicide process is described in detail. The method is described for integrating this improved resistor structure with an N-channel FET. However, it should be well understood by those skilled in the art that by using additional masking steps and ion implantations, both P- and N-channel FETs can be made on N- and P-doped wells in the substrate and that the polysilicon resistor can be integrated into these structures to form complementary metal oxide semiconductor (CMOS) circuits for mixed-mode technologies (analog/digital circuits).

Referring now to FIG. 3, a top view of a substrate 10 is shown having a field oxide 12 and a polysilicon resistor 16B patterned from a polysilicon layer. Also shown is a portion of the resistor 16B having a silicide 20 on the top surface. An interlevel dielectric (ILD) layer 22 is deposited and contact openings are etched in layer 22 to the first end 1 and second end 2 of the resistor 16B. Metal plugs 24 are formed in the contact openings. A first metal layer 26 is deposited and patterned to form electrical interconnections and is also used to make contact to the metal plugs 24 at the ends of the resistor. The metal layer is also used as a shield over the resistor to prevent hydrogen diffusion, but requires a space S to separate the electrical connection at one end of the resistor from the other end. By the method of this invention, the space S is aligned over the silicide layer 20 on the resistor 16B to provide 100% hydrogen shielding of the resistor during subsequent processing.

Referring to FIGS. 4 through 7, the sequence of steps for making this improved resistor concurrently with an N-channel FET is described. Referring first to FIG. 4, the method of making this structure begins by providing a substrate 10 having device areas. The preferred substrate is composed of a P-type single-crystal silicon having a <100> crystallographic orientation. A field oxide (FOX) 12 is then formed on the substrate surrounding and electrically isolating the device areas in which N-channel FETs will be formed. The preferred method of forming the FOX 12 is by shallow trench isolation (STI) commonly practiced in the industry. The STI is typically between about 0.3 and 0.4 micrometers (um) thick. Next, a gate oxide 14 is grown on the device areas. The gate oxide is grown to a thickness of between about 150 and 250 Angstroms.

Still referring to FIG. 4, an undoped polysilicon layer 16 is deposited on the substrate. Layer 16 is deposited by low-pressure chemical vapor deposition (LPCVD) using silane ($SiH_4$) as the reactant gas. The polysilicon layer 16 is deposited to a thickness of between about 3000 and 4000 Angstroms. A cap oxide 21 is formed on the top surface of the polysilicon layer 16 by thermal oxidation. Preferably the thermal oxidation is carried out in an oxidation furnace using dry oxidation and is grown to a thickness of between about 200 and 250 Angstroms. The polysilicon layer 16 is doped over the resistor areas by ion implantation, while a first photoresist ion-implant block-out mask (not shown) is used to prevent implanting elsewhere on the substrate. For high-value resistors the polysilicon layer 16 is doped with phosphorus to a concentration of between about $1.0\ E\ 18$ and $1.0\ E\ 19$ atoms/cm$^3$ to achieve a sheet resistivity of between about 0.1 and 0.08 ohms-cm. The polysilicon layer 16 is doped by ion implantation over the device areas while the resistor areas and other areas of the substrate are protected by a second photoresist ionimplant block-out mask (also not shown). The polysilicon layer 16 over the device areas is doped with phosphorus or arsenic to achieve a final concentration of between about $1.0\ E\ 18$ and $1.0\ E\ 19$ atoms/cm$^3$. A third photoresist etch mask is used to pattern the cap oxide 21 and the polysilicon layer 16 to form gate electrodes 16A over the device areas, and concurrently pattern layer 16 to form polysilicon resistors 16B over the field oxide regions 12. The resistors 16B are patterned to have a first end 1 and a second end 2 to which metal plug contacts will be formed. Next, lightly doped source/drain areas 17(N$^-$) are formed by ion implantation adjacent to the gate electrodes 16A in the device areas, while the resistors are protected from implantation by a photoresist block-out mask (not shown). Preferably the lightly doped source/drain areas are implanted with phosphorus ions (P$^{31}$) to have a final concentration of between about $5.0\ E\ 18$ and $1.0\ E\ 19$ atoms/cm$^3$. A conformal insulating layer 18 is deposited and anisotropically etched back to form sidewall spacers on the gate electrodes 16A. The sidewall spacers are also formed on the polysilicon resistor 16B. Layer 18 is preferably silicon oxide (SiO$_2$) and is deposited by LPCVD using, for example, tetraethosiloxane (TEOS) as the reactant gas. Typically for the current generation and future generation of semiconductor device technology having feature sizes of about 0.25 um, the insulating sidewall spacers are formed to have a width of between about 0.3 and 0.4 um.

Continuing with FIG. 4, source/drain contact areas 19(N$^+$) are formed adjacent to the sidewall spacers 16A in the device areas by ion implanting with arsenic (As) while using a photoresist block-out mask to protect other areas of the substrate from implantation. Typically the source/drain contact areas are implanted to have a final concentration of between about $5.0\ E\ 20$ and $1.0\ E\ 21$ atoms/cm$^3$.

Referring to FIG. 5, a photoresist mask (not shown) is used to remove the cap oxide from the gate electrodes 16A, and to concurrently pattern the cap oxide 21 over the resistor 16B to expose the top portion of the polysilicon resistor over the first end 1. The cap oxide 21 is preferably patterned by wet etching in hydrofluoric (HF) acid. A refractory metal layer is deposited and annealed to form a refractory metal silicide 20 on the exposed polysilicon surfaces, while the unreacted metal over the oxide surfaces is removed. Preferably the refractory metal layer is titanium (Ti), deposited by physical vapor deposition, such as sputter deposition, and is deposited to a thickness of between about 400 and 450 Angstroms. The substrate is then annealed at a temperature of less than 700° C. to form titanium silicide (TiSi$_2$) 20 on the gate electrodes 16A, TiSi$_2$ 20 on the source/drain contact areas 19(N$^+$), and, by the method of this invention, a TiSi$_2$ layer 20 over the first end 1 of the polysilicon resistor 16B. The unreacted Ti metal over the oxide surfaces on the substrate is preferably removed by selectively etching in a solution of NH$_4$OH, hydrogen peroxide (H$_2$O$_2$), and deionized water at room temperature. Then a second anneal of about 800° C. in argon (Ar) is used to lower the TiSi$_2$ sheet resistance and to stabilize the TiSi$_2$ phase.

Referring to FIG. 6, a blanket interlevel dielectric (ILD) layer 22 is deposited on the substrate over the FET and over the resistor 16B. Layer 22 is preferably SiO$_2$, and is deposited by LPCVD using TEOS as the reactant gas. The ILD layer 22 is deposited to a thickness of between about 7000 and 8000 Angstroms. Alternatively, other insulators such as borophosphosilicate glass (BPSG) or PSG can be used for the ILD layer 22. Optionally the ILD layer can be planarized, for example by chemical/mechanical polishing.

Still referring to FIG. 6, contact holes 23 are etched in the ILD layer 22 for the first level of metal interconnections. Contact holes 23 are also etched to the first and second ends 1 and 2 of the polysilicon resistor 16B. The contact holes to the first end 1 are over and to the silicide layer 20 on the resistor. Then metal plugs 24 are formed in the contact holes 23. Preferably the metal plugs 24 are formed by depositing a barrier/adhesion layer, such as titanium-titanium nitride (not shown), and depositing a tungsten (W) metal sufficiently thick to fill the contact holes 23, and the tungsten is etched back to the ILD layer 22 to form the plugs 24.

Referring to FIG. 7, the integrated circuit is completed up to the first level of metal interconnections by depositing and patterning a metal layer 26. Preferably layer 26 is composed of an aluminum/copper (AlCu) alloy, and is deposited by physical vapor deposition to a thickness of between about 8000 and 9000 Angstroms. The metal layer 26 is then patterned using conventional photolithographic techniques and anisotropic plasma etching to form metal interconnecting lines, that including contacting the metal plugs 24. The metal layer is patterned to extend over the polysilicon resistor 16B to prevent hydrogen from diffusing through the interlevel dielectric layer 22 and into the polysilicon resistor. A key feature of this invention is to pattern the metal layer 26 so that the spacing S between the metal interconnections 26 to the metal plugs 24 is aligned over the silicide layer 20. The silicide layer 20 under the spacing S increases the shielding to 100%, and therefore further protects the polysilicon resistor 16B from hydrogen intrusion that would otherwise occur during subsequent processing, such as when hydrogen is released during deposition of additional interlevel or intermetal dielectrics. This invention prevents the hydrogen from diffusing to the polysilicon grain boundary that would otherwise result in reduction of the resistance and fluctuations in resistance.

The integrated circuit can now be completed by including additional levels of intermetal dielectrics and patterned metal layers, while the metal shielding prevents the hydrogen from diffusing into the resistor.

While the invention has been particularly shown and described with reference to the preferred embodiment thereof, it will be understood by those skilled in the art that various changes in form and details may be made without departing from the spirit and scope of the invention.

What is claimed is:

1. A method for making polysilicon resistors on a substrate comprising the steps of:

providing said substrate having field oxide regions on surface of said substrate;

forming a patterned polysilicon layer having a first end and a second end on said field oxide regions;

conductively doping said patterned polysilicon layer to a predetermined concentration to form resistors;

forming a metal silicide layer over and on said first end of said patterned polysilicon layer;

depositing an interlevel dielectric layer over said patterned polysilicon layer;

forming contact holes in said interlevel dielectric layer to said first and second ends of said patterned polysilicon layer, wherein said contact holes to said first end are over and to said metal silicide layer;

depositing a metal layer and patterning to form interconnections and to make first and second metal contacts to said first and second ends of said patterned polysilicon layer, also said patterned metal layer extending over said patterned polysilicon layer to prevent hydrogen from diffusing through said interlevel dielectric layer and into said patterned polysilicon layer that forms said resistors; and further, said patterned metal layer having spaces between said first contacts and said second contacts extending over said metal silicide layer, wherein said metal silicide layer provides further protection from said hydrogen diffusion.

2. The method of claim 1, wherein said polysilicon layer is deposited to a thickness of between about 3000 and 4000 Angstroms.

3. The method of claim 1, wherein said polysilicon layer is doped by ion implanting phosphorus ions ($P^{31}$) to achieve a final concentration of between about 1.0 E 18 and 1.0 E 19 atoms/cm$^3$.

4. The method of claim 1, wherein said metal silicide layer is titanium silicide and formed to a thickness of between about 650 and 750 Angstroms.

5. The method of claim 1, wherein said metal silicide layer is tungsten silicide and formed to a thickness of between about 1500 and 2000 Angstroms.

6. The method of claim 1, wherein said interlevel dielectric layer is silicon oxide and is deposited by low-pressure chemical vapor deposition to a thickness of between about 6500 and 7500 Angstroms.

7. The method of claim 1, wherein said metal layer consists of a titanium/titanium nitride barrier layer and an upper conducting layer composed of an aluminum/copper alloy.

8. The method of claim 7, wherein said titanium is deposited to a thickness of between about 400 and 450 Angstroms, and wherein said titanium nitride is deposited to a thickness of between about 1000 and 1100 Angstroms.

9. The method of claim 7, wherein said aluminum/copper alloy is deposited by physical vapor deposition to a thickness of between about 4500 and 5500 Angstroms.

10. The method of claim 1, wherein said metal layer consists of tungsten metal plugs in said contact holes and an aluminum/copper alloy layer for said interconnections.

11. A method for making polysilicon resistors and field effect transistors (FETs) on a substrate comprising the steps of:

providing a semiconductor substrate and forming field oxide regions surrounding and electrically isolating device areas on said substrate;

growing a gate oxide on said device areas;

depositing a polysilicon layer on said substrate and forming a cap oxide by thermal oxidation;

using a first photoresist ion-implant block-out mask and doping said polysilicon layer over said device areas;

using a second photoresist ion-implant block-out mask and doping said polysilicon layer to a predetermined concentration to form resistors over said field oxide regions;

patterning said polysilicon layer having said cap oxide to form gate electrodes on said device areas and concurrently forming polysilicon resistors having a first end and a second end on said field oxide regions;

forming lightly doped source/drain areas adjacent to said gate electrodes in said device areas;

depositing and anisotropically etching back an insulating layer to form sidewall spacers on said gate electrodes;

implanting selectively to form source/drain contact areas adjacent to said sidewall spacers in said device areas;

removing said cap oxide from said gate electrodes, and concurrently patterning said cap oxide over said resistors to remove portions over said first ends of said resistors;

depositing a refractory metal layer and annealing to form polycide gate electrodes, silicide source/drain contacts, and a silicide layer over said first end of said polysilicon resistor;

removing selectively unreacted refractory metal on all silicon oxide surface;

depositing an interlevel dielectric layer over said substrate;

forming contact holes in said interlevel dielectric layer including contact holes to said first and second ends of said polysilicon resistor, wherein said contact holes to said first end are over and to said silicide layer;

forming metal plugs in said contact holes;

depositing a metal layer and patterning to form interconnections to said metal plugs;

said patterned metal layer extending over said polysilicon resistors to prevent hydrogen from diffusing through said interlevel dielectric layer and into said polysilicon resistors;

and resulting spaces between said interconnections over polysilicon resistor are aligned over said silicide layer, wherein said silicide layer provides further protection from said hydrogen diffusion.

12. The method of claim 11, wherein said polysilicon layer is deposited to a thickness of between about 3000 and 3500 Angstroms.

13. The method of claim 11, wherein said polysilicon layer is doped by ion implanting phosphorus ions ($P^{31}$) to achieve a final concentration of between about 1.0 E 18 and 1.0 E 19 atoms/cm$^3$.

14. The method of claim 11, wherein said metal silicide layer is titanium silicide and formed to a thickness of between about 650 and 750 Angstroms.

15. The method of claim 11, wherein said metal silicide layer is tungsten silicide and formed to a thickness of between about 1500 and 2000 Angstroms.

16. The method of claim 11, wherein said interlevel dielectric layer is silicon oxide and is deposited by low-pressure chemical vapor deposition to a thickness of between about 6500 and 7500 Angstroms.

17. The method of claim 11, wherein said metal layer consists of a titanium/titanium nitride barrier layer and an upper conducting layer composed of an aluminum/copper alloy.

18. The method of claim 17, wherein said titanium is deposited to a thickness of between about 400 and 450 Angstroms, and wherein said titanium nitride is deposited to a thickness of between about 1000 and 1100 Angstroms.

19. The method of claim 17, wherein said aluminum/copper alloy is deposited by physical vapor deposition to a thickness of between about 4500 and 5500 Angstroms.

20. The method of claim 11, wherein said metal layer consists of tungsten metal plugs in said contact holes and an aluminum/copper alloy layer for said interconnections.

* * * * *